United States Patent
Kang et al.

(10) Patent No.: US 6,582,616 B2
(45) Date of Patent: Jun. 24, 2003

(54) METHOD FOR PREPARING BALL GRID ARRAY BOARD

(75) Inventors: Myung-Sam Kang, Daejeon (KR); Keon-Yang Park, Seoul (KR); Won-Hoe Kim, Seoul (KR)

(73) Assignee: Samsung Electro-Mechanics Co., Ltd., Kyunggi-do (KR)

( * ) Notice: Subject to any disclaimer, the term of this patent is extended or adjusted under 35 U.S.C. 154(b) by 73 days.

(21) Appl. No.: 09/984,284

(22) Filed: Oct. 29, 2001

(65) Prior Publication Data

US 2003/0042224 A1 Mar. 6, 2003

(30) Foreign Application Priority Data

Jul. 27, 2001 (KR) .................................. 2001-45545

(51) Int. Cl.[7] ........................... H01B 13/00; H05K 3/36
(52) U.S. Cl. ............................. 216/13; 216/17; 216/20; 174/250; 174/259; 174/260; 29/846; 29/854
(58) Field of Search ................... 216/13, 17, 20; 174/250, 259, 260; 29/846, 854

(56) References Cited

U.S. PATENT DOCUMENTS 6,393,696 B1 * 5/2002 Yoon et al. .................. 29/830

2001/0000156 A1 * 4/2001 Cheng ......................... 438/612

FOREIGN PATENT DOCUMENTS

JP 10-116933 5/1998

* cited by examiner

Primary Examiner—Benjamin L. Utech
Assistant Examiner—Shamim Ahmed
(74) Attorney, Agent, or Firm—Morgan, Lewis & Bockius LLP

(57) ABSTRACT

Disclosed are a method for preparing a high performance BGA board containing a plurality of printed circuit boards in which a conductor circuit, a bonding pad electrically connected to a semiconductor chip, and an inner hole for mounting a semiconductor chip are formed, by primary- and secondary-laminating a plurality of boards. The present invention enjoys advantages in that contamination due to an outer layer surface treatment of the board laminate can be prevented, and a process for preventing a contamination of an inner hole can be omitted, and also a defective proportion can be reduced remarkably in comparison with prior arts by applying a pressure uniformly during a secondary lamination. Furthermore, a BGA board according to the invention has an ideal ball pitch and multi-fins, excellent electrical and thermal properties, also can be applied in the case of high current, and can be easily mounted on a chip.

13 Claims, 6 Drawing Sheets

METHOD FOR PREPARING BALL GRID ARRAY BOARD

BACKGROUND OF THE INVENTION

1. Field of the Invention

The present invention relates, in general, to a method for preparing a high performance BGA board and, more particularly, to a method for preparing a high performance BGA board containing a plurality of printed circuit boards in which a conductor circuit, a bonding pad to be electrically connected to a semiconductor chip, and an inner hole for mounting a semiconductor chip are formed by primary- and secondary-laminating a plurality of boards.

2. Description of the Prior Art

The great advance in the electronics industry is, at least in part, based on the development of the electronic parts industry. As electronic parts have been developed into slim ones of high performance, they can be more highly integrated in one board. To the development of electronic parts, multi-layer printed circuit boards make a contribution.

With the aim of mounting highly integrated electronic parts thereon, multi-layer printed circuit boards have a structure in which elemental boards having a plurality of circuits are laminated. Multi-layer printed circuit boards may have various forms, and be manufactured by various methods.

For example, Japanese Patent Publication No. Hei. 5-183272 discloses a method for manufacturing a multilayer board for mounting electronic parts, in which a multilayer board is prepared which is formed by bonding a substratum wherein a recessed part for mounting electronic parts and a conductor pattern are formed, an adhering layer, and an upper layer board provided with an opening part. Through-holes are formed in the multilayered board. After a sheet type mask covering an opening part is thermo-compression bonded to the uppermost part of the multilayered board, the whole surface of the multilayered board and through-holes are plated with copper. Conductor patterns are formed on the upper part and the lower part by an etching process, and then the sheet type mask is eliminated from the upper part. The above method makes use of a separate mask to cover the aperture part of the inner hole in order to prevent a conductor pattern exposed at a recessed part for mounting electronic parts from being damaged when manufacturing a multilayered board for mounting electronic parts. This conventional method, however, has problems in that there are required additional processes of using a mask only to protect an inner hole and subsequently eliminating the mask from the multilayered board.

To avoid the problem that conventional boards have, much effort has been made to manufacture boards that are of a high multi-layer structure and of excellent thermal stability. In the boards, semiconductor chips are bonded onto heat sinks while binding to bonding pads in the form of steps.

There are disclosed various methods for establishing heat sinks in printed circuit boards. For example, Japanese Patent Publication No. Hei. 10-116933 discloses a multi-layer printed wiring board for mounting IC, in which a heat sink is fixed firmly on a laminated structure by soldering, with IC being fixed firmly on the heat sink via a resin adhesive. In addition, opening parts are made on each board as well as the outermost board; through-holes are established in the laminated board; the walls of the through-holes and the outer layer surface of the board laminate are plated with metal; and a conductor circuit is provided onto the outermost board. The conductor circuit patterned on the outermost board is made by etching the metal coating plated on the surface of the outermost board.

When patterning the conductor circuit on the outermost board and plating the through-holes and outer layer of the multilayered printed circuit board, however, the opening parts and a surface of the mounting part may be contaminated with the plating liquid and the etchant. Another problem with the conventional method is the contamination that inevitably occurs because a bonding pad of the inner layer circuit provided to each board is formed in each opening part.

In order to overcome the problem, the surface of the opened mounting part should be coated with a resist film before forming a conductor circuit by plating and etching, and then the resist film should be eliminated. Alternatively, a mask may be used. The method, therefore, suffers from the disadvantage of requiring the additional step of plating or the additional step of using and eliminating a mask in order to protect an inner hole.

As described above, boards of prior arts are fabricated in complicated processes at high production cost. Also, it is difficult to obtain miniaturized and high performance electronic parts by use of boards of the prior arts.

SUMMARY OF THE INVENTION

Therefore, it is an object of the present invention to solve the above problems, and to provide a method for preparing a high performance BGA board in which contamination due to an outer layer surface treatment of the board laminate can be prevented and an additional process for preventing a contamination of an inner hole can be omitted.

It is another object of the present invention to provide a method for preparing a high performance BGA board in which a defective proportion can be reduced remarkably in comparison with prior arts by applying a pressure uniformly during a secondary lamination without an additional process.

It is further object of the present invention to provide a method for preparing a high performance BGA board which has an ideal ball pitch and multi-fins, excellent electrical and thermal properties, and also can be applied in the case of high current, and can be easily mounted on a chip.

In accordance with the first aspect of the present invention, the method for preparing the BGA board containing a plurality of printed circuit boards, in which a conductor circuit, an inner hole for mounting a semiconductor chip and a bonding pad to be electrically connected with the semiconductor chip are formed, comprising the steps of:

a) providing top and bottom boards having neither inner hole nor conductor circuit, a board to contact with a bottom side of said top board in which an inner hole is established without a conductor circuit, and at least one of boards in which a conductor circuit and an inner hole are established;

b) forming a primary-laminated structure having an opening part in an upper part thereof, by arraying the lower boards except said top board, and laminating the lower boards together by use of an adhesive to form a step-typed combination of the inner holes;

c) forming a secondary-laminated structure by overlaying said top board onto the primary-laminated structure by use of the adhesive;

d) forming through-holes in the secondary-laminated structure, followed by establishing a conductor circuit on the secondary-laminated structure including the through-holes by copper plating, dry film lamination, exposure, developing and etching; and e) removing a part of said top board which covers the step-typed combination of the inner holes to form a cavity with the upper end opened, followed by providing a bonding pad in the cavity to give an individual BGA board.

In accordance with the second aspect of the present invention, the method for preparing the BGA board containing a plurality of printed circuit boards, in which a conductor circuit, an inner hole for mounting a semiconductor chip and a bonding pad to be electrically connected with the semiconductor chip are formed, comprising the steps of:

a) providing top and bottom boards having neither inner hole nor conductor circuit, a board to contact with a bottom side of said top board in which an inner hole is established without a conductor circuit, and at least one of boards in which a conductor circuit and an inner hole are established;

b) forming a primary-laminated structure with an opening part in an upper part thereof, by arraying the lower boards except said top board, and laminating the lower boards together by use of an adhesive to form a step-typed combination of the inner holes;

c) forming a secondary-laminated structure by overlaying said top board onto the primary-laminated structure by use of the adhesive;

d) forming through-holes in the secondary-laminated structure, followed by establishing a conductor circuit on the secondary-laminated structure including the through-holes by copper plating, dry film lamination, exposure, developing and etching;

e) removing parts of the top and bottom boards which covers the step-typed combination of the inner holes to form a cavity with both vertical ends opened, followed by providing a bonding pad in the cavity to give an individual BGA board; and f) bonding a heat sink to a lower part of said individual BGA board by use of the adhesive.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE INVENTION

Figure 1:
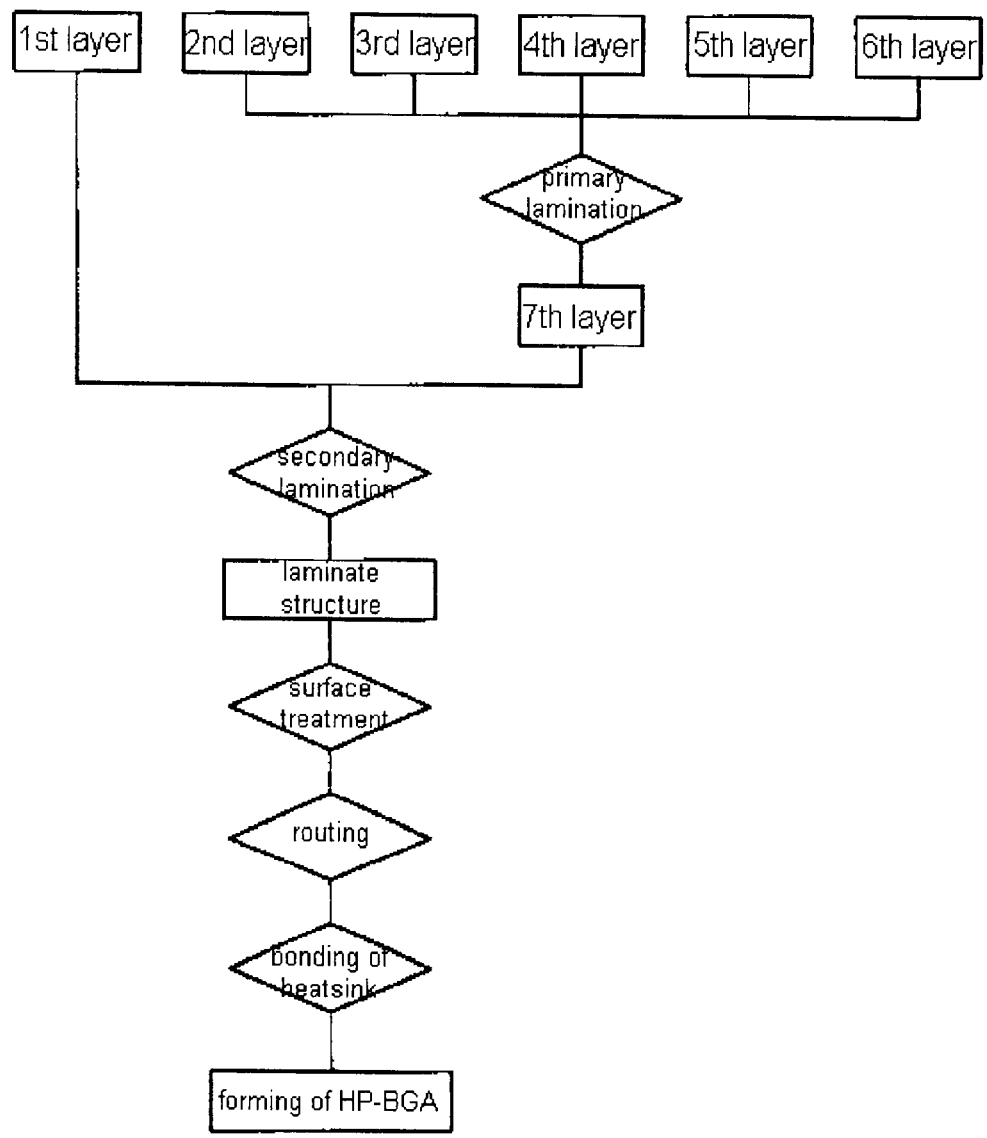
FIG. 1 is a flow chart illustrating an entire procedure for preparing a high performance BGA board according to the present invention.

The present invention pertains to a method for fabricating a BGA board consisting of a plurality of printed circuit boards, provided with a conductor circuit, an inner hole for mounting a semiconductor chip and a bonding pad to be electrically connected with the semiconductor chip. The elemental printed circuit boards are prepared according to their respective features, and then bonded to one another by the use of an adhesive such as prepreg. Elemental boards with prepreg are layered in a pre-layup step and then bonded together at a high temperature under high pressure or vacuum pressure.

The application of the preferred embodiments of the present invention is well understood with reference to the accompanying drawings, wherein like reference numerals are used for like and corresponding parts, respectively.

FIG. 1 is a flow chart illustrating an entire procedure of fabricating a six-layered structure of a high performance BGA board according to the present invention.

In order for a BGA board to be excellent in thermal performance and be able to operate with a high speed at a low voltage, at least two bonding areas should be provided for the BGA board, making a plurality of elemental boards necessary for the fabrication of the BGA board. To correspond to a multi-fin structure for high performance, thus, the BGA board should have a several layer structure, preferably a four-layered structure, and more preferably a five- or more-layered structure. In the present invention, the six-layered structure board is illustrated.

Returning now to FIG. 1, a circuit board of a six-layered structure of a cavity-down type is stepwise fabricated. Firstly, each of a first to a sixth layer boards is separately processed according to their respective features. In the FIG. 1, the first (top) board and the sixth (bottom) board have neither inner hole nor conductor circuit. Further, the second board to contact with a lower part of the first board has an inner hole established without a conductor circuit. In addition, the third to fifth boards have a conductor circuit and an inner hole thereon.

Then, a primary laminated structure as designated a seventh layer board, is made by arraying lower boards ranging from the second to sixth boards in order, laminating the lower boards together by use of an adhesive to form a step-typed combination of the inner holes. In this primary lamination step, an opening part is formed in an upper part of the laminate structure. Further, a cushion pad or a packing resin is optionally used in order to prevent the pressure from being non-uniformly applied throughout the layers due to the thickness deviation thereof. After completion of the fabrication of the primary laminate structure, a secondary lamination step is conducted, in which the first board is overlaid onto the primary laminated structure by use of an adhesive to give a BGA board laminate structure.

After the formation of the second laminate structure, through-holes are established. Then, the structure is provided with a conductor circuit by a series of steps, including copper plating, D/F lamination, exposure, developing, and etching. A part of the top board which covers the combination of the inner holes in removed. Thus, a cavity is formed in the laminate structure with the upper end of the cavity being exposed. Subsequently, a bonding pad is provided in the cavity, and the laminate structure is cut, for example, with the aid of a router, to produce an individual BGA board laminate.

Alternatively, after a conductor circuit is established on the second laminate structure by a series of steps, including copper plating, D/F lamination, exposure, developing, and etching, parts of the top and bottom boards, which cover the step-typed combination of the inner holes, are removed, thus a cavity is made in which the both vertical ends thereof are opened. Subsequently, a bonding pad is provided on the cavity. Cutting the laminate structure, for example, with the aid of a router, produces an individual BGA board laminate. Finally, a heat sink is mounted onto the laminate to complete the fabrication of the BGA board of the present invention.

As described above, a method for preparing the high performance BGA board according to the this invention has advantages, in comparison with conventional techniques, in that excellent effects can be obtained without separate apparatus and additional processes only by separating the steps to be employed to laminate conventionally prepared elemental boards.

The fabricating steps illustrated in the flow chart of FIG. 1 are, in detail, illustrated in FIGS. 2 to 8, respectively. Nevertheless, the above figures should not be construed to limit the present invention.

Figure 2:
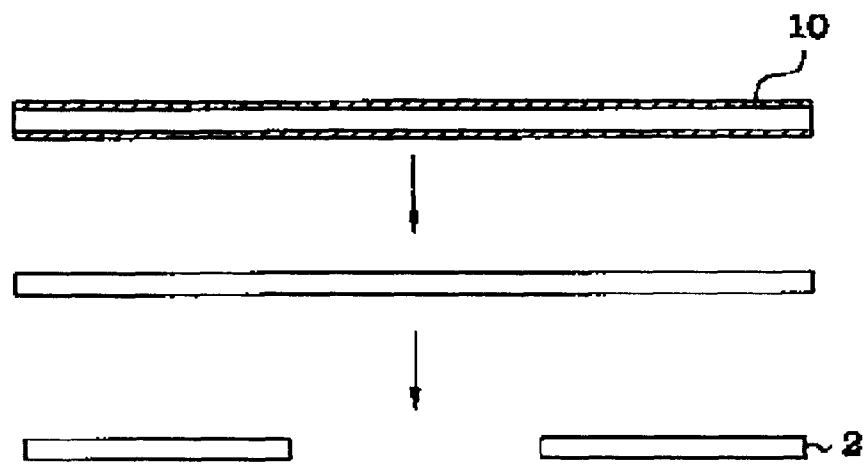
FIG. 2 is a schematic illustrating a procedure for preparing a board 2 according to an embodiment of the present invention.

With reference to FIG. 2, there is illustrated a step for fabricating a board which is positioned at the second layer in the BGA laminate structure when numbering from top to bottom. Hereinafter, the ordinal number prepositioned to "layer board" is determined when numbering the boards from top to bottom. As seen in this figure, the second layer board 2 bonded directly to the top layer board is provided for protecting the circuit-bearing layers of the lower laminate structure when the a part of the top layer board is removed to form a cavity during the subsequent step, and for controlling the whole thickness of the laminate structure. In the second layer board 2, an inner hole for mounting the semiconductor chip is formed, but no circuits are provided. In this regard, as shown in FIG. 2, the fabrication of the second layer board starts with a CCL (copper clad layered) board whose opposite sides are plated with a copper film 10. After etching the whole copper film 10, the inner hole is formed in a proper size by use of a router.

In the mean time, boards useful in the present invention may be made of glass epoxy resin, glass bismaleimide triazine resin, glass polyimide resin, polyethylene terephthalate, polyphenyl sulfone, or polyimide, and preferably glass epoxy resin, but are not limited to them.

Figure 3:
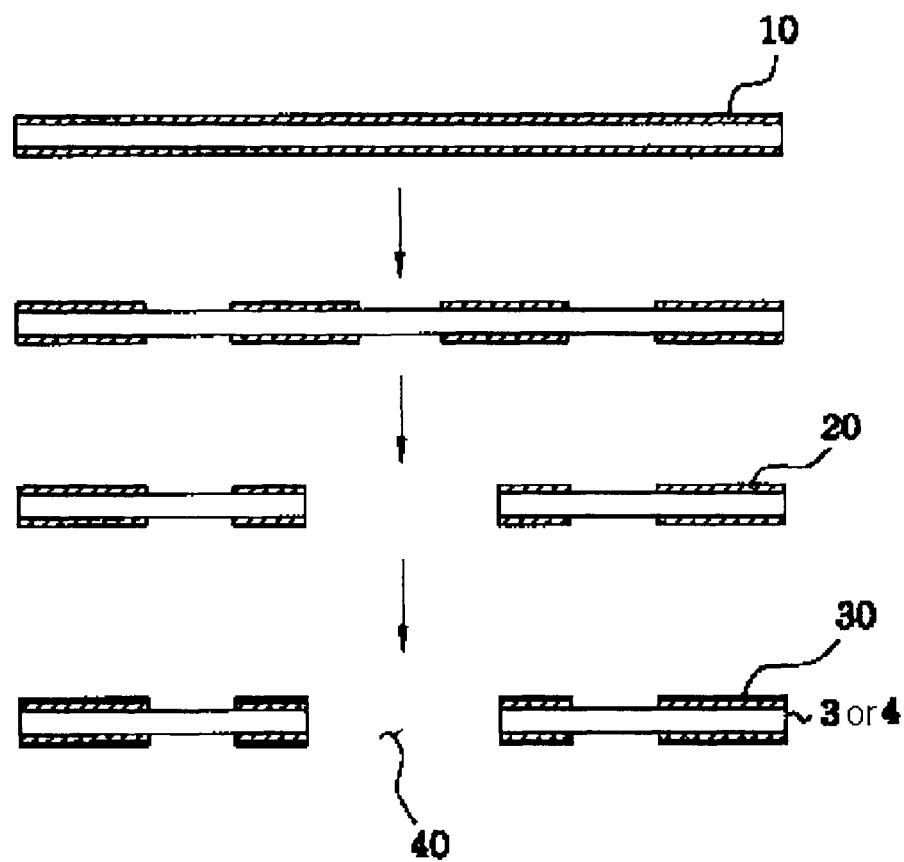
FIG. 3 is a schematic illustrating a procedure for preparing a board 3 or 4 according to an embodiment of the present invention.

Furthermore, with reference to FIG. 3, there is illustrated a procedure for fabricating a board which is positioned at a third or fourth layer in FIG. 1. In the present invention, there is provided a board, in which a bonding pad to be connected to a semiconductor chip and a conductor circuit functioning as a main element of the semiconductor chip on the board layer are formed, and the conductor circuit and an inner hole for mounting the semiconductor chip are established in order to transmit electric signals. As shown in FIG. 3, a board is provided with a conductor circuit 20 in an upper and lower part of the board by a series of steps, including dry film (D/F) lamination, exposure, developing, and etching of a CCL board whose opposite sides are plated with a copper film 10. Thereafter, an inner hole 40 is formed at a proper size by a router, and a blackened surface 30 is formed to easily laminate boards.

A method for forming the conductor circuit as described above may be selected from a conventional method, such as a tenting method, a soldering delaminating method, a fluoditive method, and a transcription method which comprises forming a conductor circuit by electrolytic copper plating and transcribing it by use of an adhesive such as prepreg.

Figure 4:
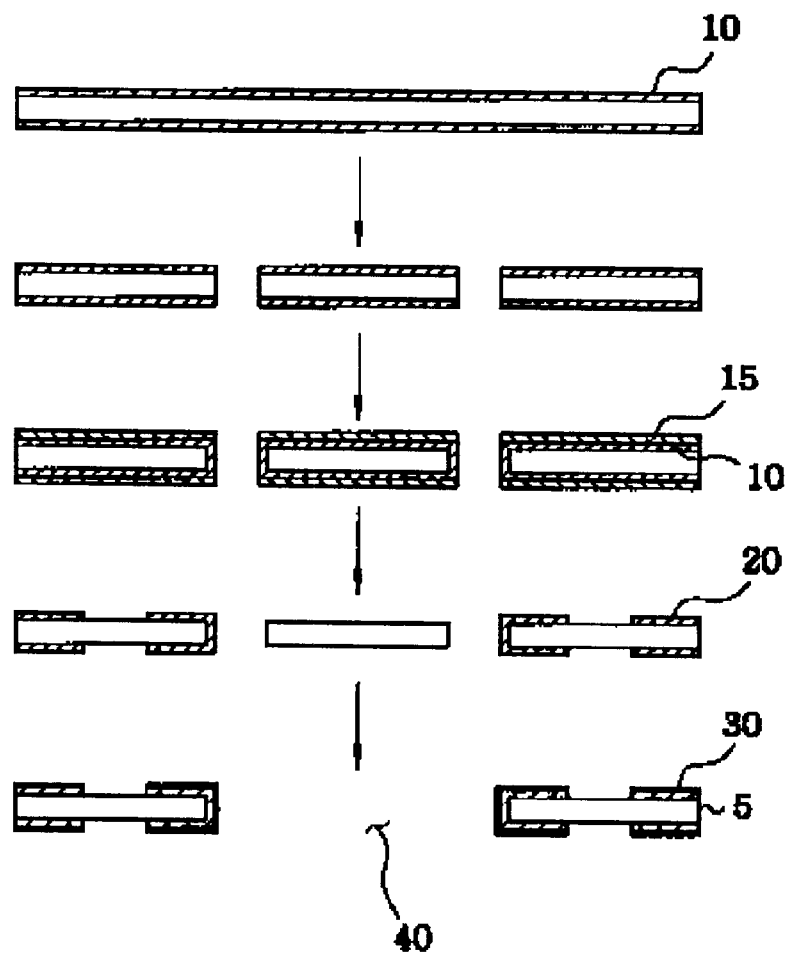
FIG. 4 is a schematic illustrating a procedure for preparing a board 5 according to an embodiment of the present invention.
Figure 5:
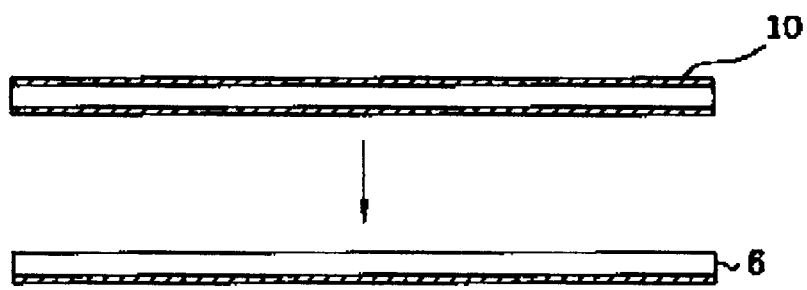
FIG. 5 is a schematic illustrating a procedure for preparing a board 6 according to an embodiment of the present invention.

FIG. 4 schematically illustrates a procedure for preparing another type of board, in which a bonding pad to be connected to a semiconductor chip as in FIG. 3 and a conductor circuit functioning as a main element of the semiconductor chip on the board layer are formed, and another board in which a conductor circuit and an inner hole for mounting the semiconductor chip are established in the board in order to transmit electric signals. For example, this type of a board is applicable to the fifth layer board 5 in FIG. 1, and a sidewall of the resulting board is plated.

In FIG. 4, a slot is established by an inner slot router in a CCL board whose opposite sides are plated with a copper film 10, and all sides of the CCL board are plated with copper 15. Then, the board is provided with a conductor circuit by a series of steps, including D/F lamination, exposure, developing, and etching, followed by drilling to form an inner hole. Thus, the board of which a sidewall is plated is manufactured, and thereafter a surface of the board is blackened to easily laminate boards.

An alternative method for fabricating a board in which a sidewall of the board is plated, not shown in drawings, may be accomplished by establishing an inner hole in a CCL board whose opposite sides are plated with a copper film 10, and processing a surface of the board by a series of steps including D/F lamination, exposure, developing, Sn/Pb plating and etching.

Furthermore, an inner hole may be formed by punching a board with a die such as a drill, or cutting it with a end mill before/after forming of a conductor circuit, as shown in FIGS. 3 and 4.

Returning to FIG. 5, there is illustrated a procedure for manufacturing a sixth layer board 6 in FIG. 1, i.e. a bottom board having neither an inner hole for mounting a semiconductor nor a conductor circuit in order to protect the inner holes of the board laminate. A CCL board whose opposite sides are plated with a copper film 10 is processed by a series of steps including exposure, developing and etching, and then the upper copper film on the CCL board is removed to manufacture the bottom board 6.

Figure 6:
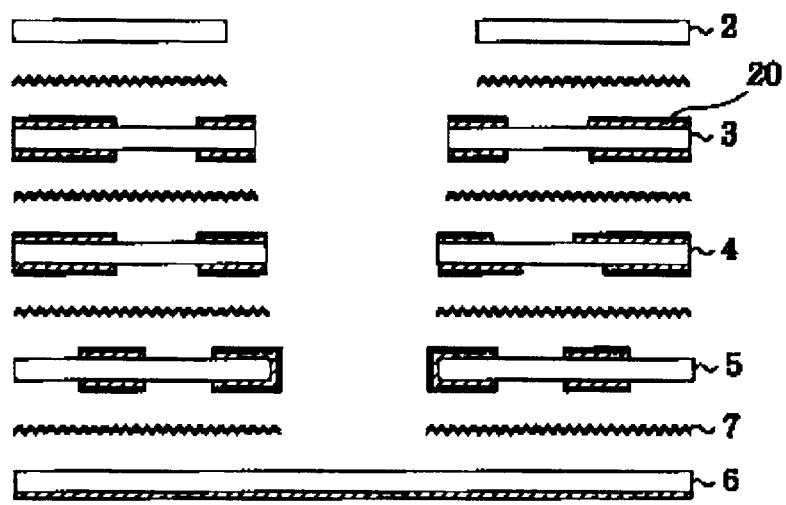
FIG. 6 is a schematic illustrating a procedure for primary-laminating boards with the use of an adhesive according to an embodiment of the present invention.

With reference to FIG. 6, there is illustrated an arrangement of boards of FIGS. 2 to 5 with the use of an adhesive 7 such as prepreg. A primary lamination step designates a step for forming a board laminate structure (not shown in FIG. 6) with an opening part in an upper part thereof by pressing boards as shown in FIG. 6 simultaneously. In this step, the boards are laminated by a rivet method under vacuum pressure to prevent the layers from being layered in a staggered pattern. The primary lamination may be also accomplished by use of a cushion pad or a packing resin in order to prevent production of defective boards due to a deviation of the thickness and size. Further, in order to apply the first layer to an accurate position later, scale data, which will be used to process rivet holes, may be secured by an inspector target previously established within the primary laminated structure. In addition, the adhesive 7 is bigger than an inner hole of each layer by 40 to 60 μm. Preferably, the primary lamination is carried out at 180 to 220° C. under a pressure of 30 to 40 Kg/cm².

In addition, an adhesive 7 suitable for use in the present invention may be a film type adhesive sheet obtained by combining a rubber, such as NBR, acryl resin, polyvinylbutyral resin, phenol resin, etc. preferably by combining polyvinylbutyral resin, acrylic resin and/or phenol resin having a low fluidity with prepreg or epoxy resin. Furthermore, a material of the adhesive may preferably be the same as that of the board. For example, prepreg in which glass epoxy is deposited may be used in the case of a glass epoxy resin board.

Returning to FIG. 7, there is illustrated a procedure for manufacturing a first layer board 1 in FIG. 1, i.e. a top board having neither an inner hole for mounting a semiconductor nor a conductor circuit in order to protect an inner hole of the board laminate. A CCL board whose opposite sides are plated with a copper film 10 is processed by a series of steps including exposure, developing and etching, and then a lower copper film of the CCL board is removed.

Figure 7:
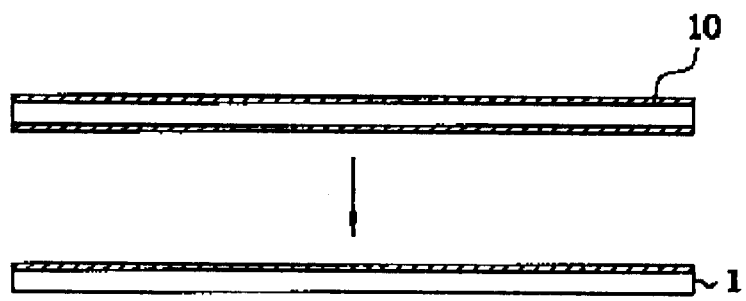
FIG. 7 is a schematic illustrating a procedure for preparing a board 1 according to an embodiment of the present invention.
Figure 8:
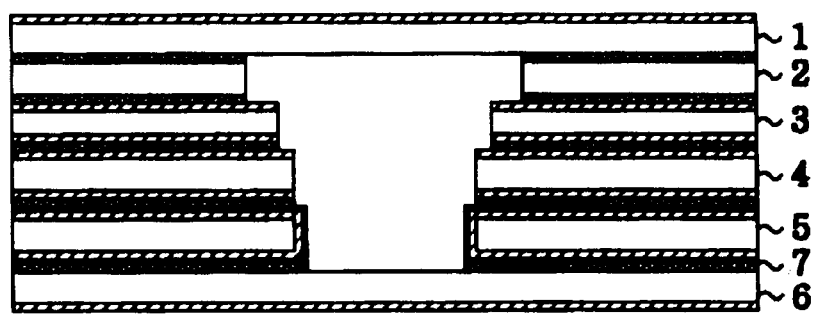
FIG. 8 is a schematic illustrating a procedure for preparing a secondary laminated structure by laminating a top board 1 and a primary laminated structure according to an embodiment of the present invention.

In FIG. 8, there is illustrated a secondary laminated structure, in which a first layer board 1, i.e. the top board in FIG. 7 and a seventh layer laminated structure (a laminated structure of 2 to 6 layers), i.e. a primary laminated structure in FIG. 6 are bonded each other by use of a prepreg 7. In this step, boards are laminated by a rivet method under vacuum pressure to prevent the layers from being layered in a staggered pattern. Further, in order to apply the first layer to an accurate position later, scale data, which will be used to process pinning holes for forming a through-hole, may be secured by an inspector target previously established within the primary laminated structure. Preferably, a secondary lamination process is carried out at 180 to 220° C. under a pressure of 30 to 40 Kg/cm².

Furthermore, the top and bottom board can prevent the step-typed combination of the inner holes for mounting a semiconductor chip from being contaminated due to an outer layer surface treatment of the board laminate, and a process for preventing a contamination of an inner hole can be omitted. Also controlling laminating without subsequent processes, that is to say, laminating all boards at one time, can reduce defective due to a deviation of the thickness and size, and the method can be applied regardless of the number of boards.

Figure 9:
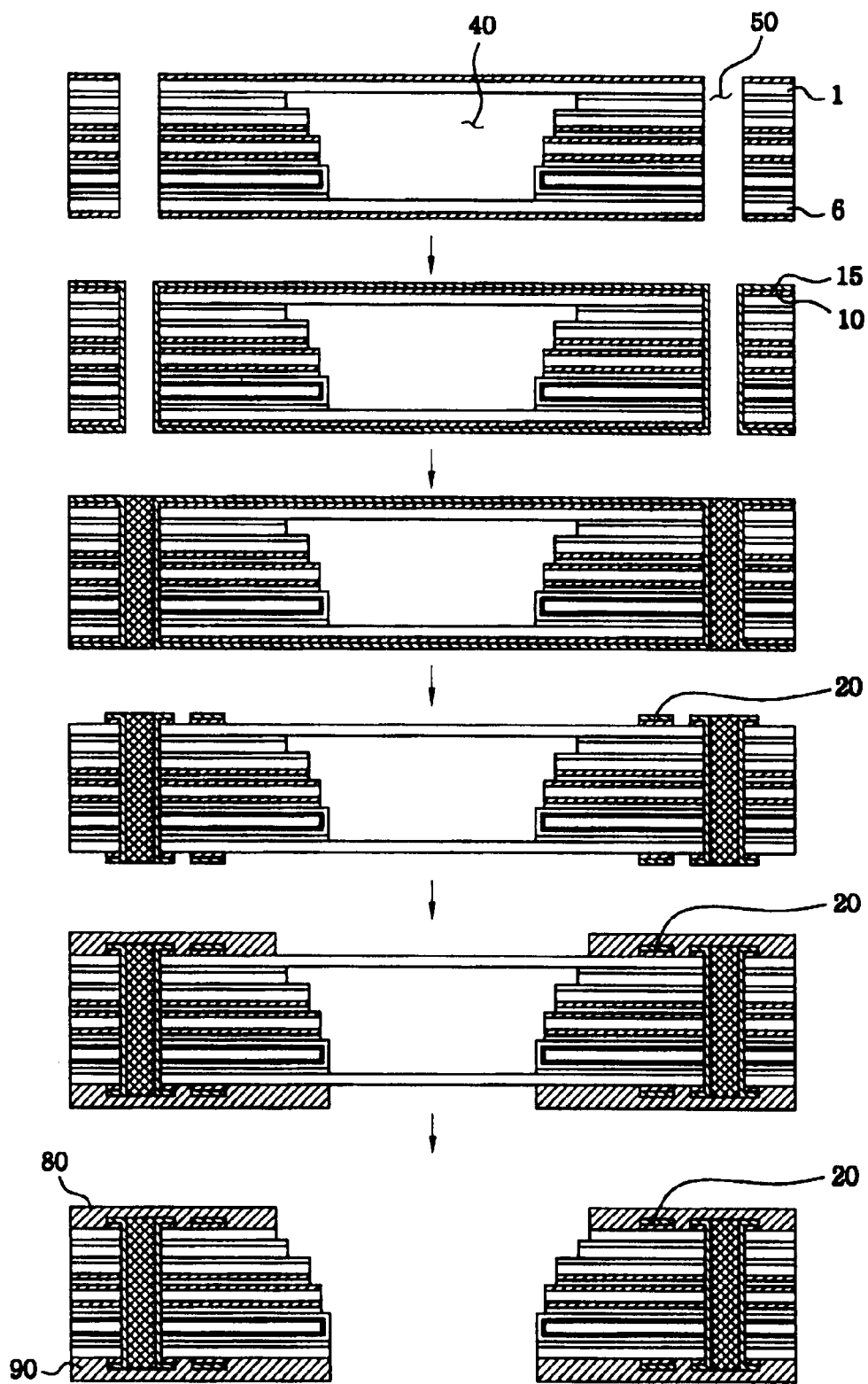
FIG. 9 illustrates a procedure for forming a conductor circuit by processing a surface of a laminated structure according to an embodiment of the present invention.
Figure 10:
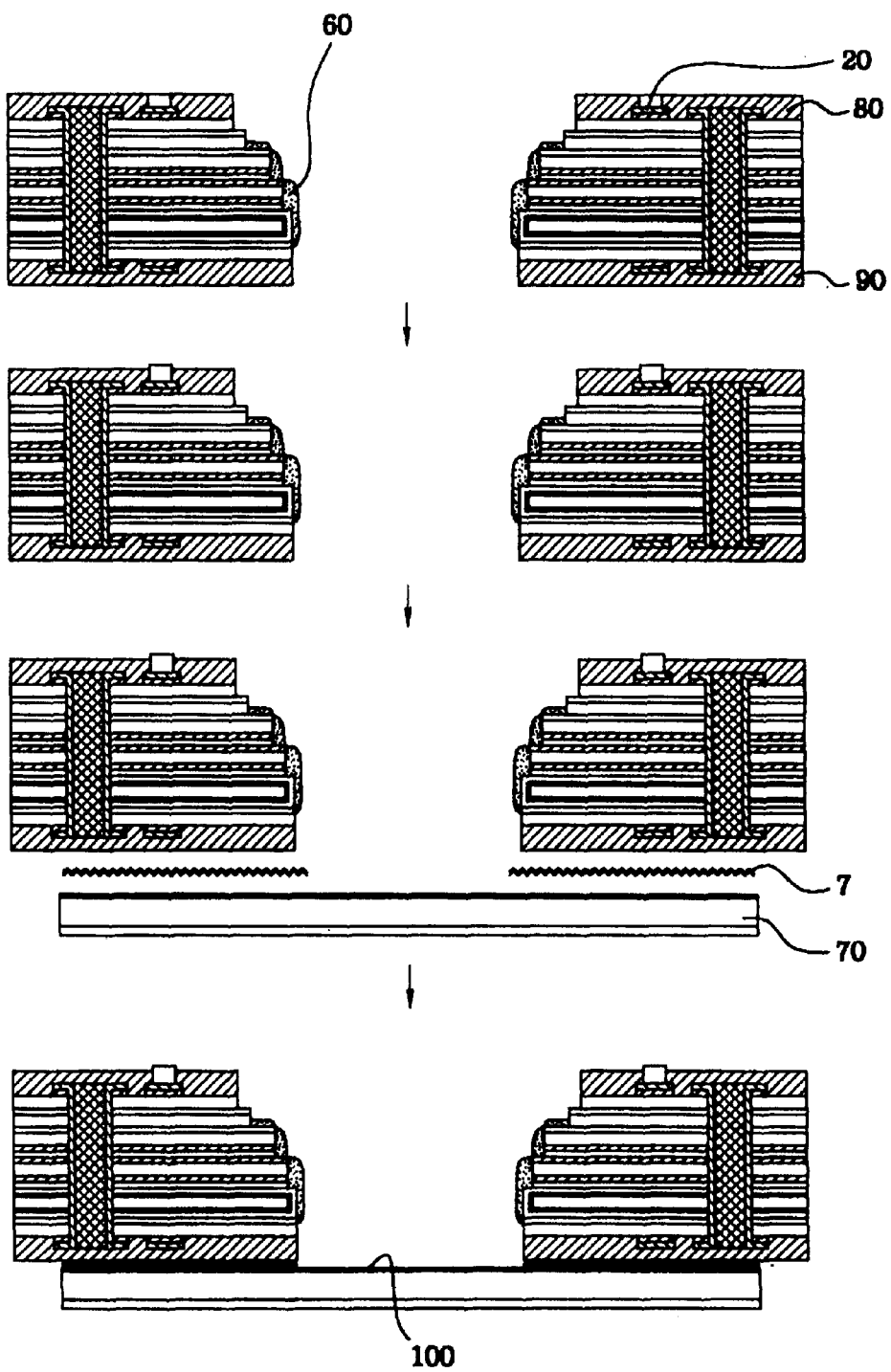
FIG. 10 is a schematic illustrating a final procedure for preparing a high performance BGA board by bonding a heat sink to a secondary laminated structure according to the present invention.

FIG. 9 illustrates a procedure for forming a conductor circuit on a laminated structure according to another embodiment of the present invention; and FIG. 10 illustrates a final procedure for preparing final product of the high performance BGA to which the heat sink is bonded according to the present invention.

As shown in FIG. 9, a through-hole is drilled on a predetermined position of the BGA board laminated structure, i.e. a second laminated structure. Then, 0.1 to 5.0 μm, preferably about 1 μm of a conductor film is formed by an electroless copper plating 15 of the whole secondary laminated structure containing a through-hole. And the through-hole is via filled with reliable epoxy resin and dried thoroughly for smooth transmission of the electric signal, as shown in FIG. 9. After a through-hole is dried thoroughly, a dry film resist is laminated in an outer layer of a laminated structure, and a conductor circuit 20 is formed by a series of steps including exposure, developing, and etching.

After the conductor circuit 20 is formed, a solder resist 80 and 90 such as epoxy or acryl are formed on an upper and lower part, respectively. Then, parts covering the combination of the inner holes 40 in the top and bottom boards are removed by router. Thereby, a cavity for mounting a semiconductor is obtained with the both vertical ends opened.

Thereafter, a bonding pad to be electrically connected to a semiconductor chip in a BGA board laminated structure in which the cavity for mounting a semiconductor chip is formed, is plated with gold or silver in order to connect to the semiconductor chip easily when the semiconductor chip and the bonding pad are wire bonded with gold or aluminum wire. Then, an individual BGA board may be provided by router (a second step of FIG. 10).

Finally, a HP-BGA of the present invention is prepared by bonding a heat sink 70 to a lower part of the individual BGA board with the use of prepreg 7 in order to fully dissipate heat of the board, and then a semiconductor chip is mounted on a chip-mounting part 100.

Usually, the heat sink is made of copper foil. The elemental boards of the BGA board laminated structure are preferably made of glass epoxy resin because its coefficient of thermal expansion is similar to that of copper which is a material of the conductor circuits fabricated on the board, in order to prevent the conductor circuits from being separated. Therefore, it is preferred that the heat sink is prepared from copper foil for the same reason. Alternatively, an aluminum plate may also be used, which can dissipate heat with high efficiency. Another alternative is a stainless steel plate which is highly resistant to corrosion. A Ni-plated layer is formed to a thickness of 2 to 10 μm on the copper foil by electrolytic plating. Then, acidic components which are produced during the electrolytic plating are rinsed off, and the surface is blackened in order to improve the adhesiveness between the surface and the board.

In accordance with the present invention, the heat sink may be an individual heat sink that is difficult to apply to a conventional method, as well as a conventional strip-type heat sink.

The HP-BGA prepared according to the present invention has advantages in that the number of fins amounts to as many as 600 to 1000 and the heat generated from a semiconductor chip can be effectively dissipated, thereby allowing high-speed boards to be operated homeostatically.

As described above, the inventive HP-BGA can be manufactured by primary laminating simultaneously lower layer boards except a top layer board, followed by secondary laminating the top layer board on the primary board laminate. Therefore, the present invention enjoys advantages in that contamination due to an outer layer surface treatment of the board laminate can be prevented, and a process for preventing a contamination of an inner hole can be omitted, and also a defective proportion can be reduced remarkably in comparison with prior arts by applying a pressure uniformly during a secondary lamination. And the top and bottom board for protecting the inner holes can be manufactured by a conventional method, so that an additional process is not necessary.

Furthermore, a BGA board according to the present invention has an ideal ball pitch and multi-fins, excellent electrical and thermal properties, also can be applied in the case of high currency, and can be easily mounted on a chip.

Many modifications and variations of the present invention are possible in light of the above teachings, and the present invention will be more clearly understood from the appended claims.

What is claimed is:

1. A method for preparing the BGA board containing a plurality of printed circuit boards, in which a conductor circuit, an inner hole for mounting a semiconductor chip and a bonding pad to be electrically connected with the semiconductor chip are formed, comprising the steps of:
   a) providing a top and bottom board having neither inner hole nor conductor circuit, a board to contact with a bottom side of said top board in which an inner hole is established without a conductor circuit, and at least one of boards in which a conductor circuit and an inner hole are established;
   b) forming a primary-laminated structure having an opening part in an upper part thereof, by arraying the lower boards except said top board, and laminating the lower boards together by use of an adhesive to form a step-typed combination of the inner holes;
   c) forming a secondary-laminated structure by overlaying said top board onto the primary-laminated structure by use of the adhesive;
   d) forming through-holes in the secondary-laminated structure, followed by establishing a conductor circuit on the secondary-laminated structure including the through-holes by copper plating, dry film lamination, exposure, developing and etching; and
   e) removing a part of said top board which covers the step-typed combination of the inner holes to form a cavity with the upper end opened, followed by providing a bonding pad in the cavity to give an individual BGA board.

2. The method for preparing the BGA board according to claim 1 further comprising bonding a heat sink to a lower part of said individual BGA board with the use of an adhesive.

3. The method for preparing the BGA board according to claim 1, wherein the adhesive is bigger than each inner hole of the boards except the top and bottom board by 40 to 60 $\mu$m in the b) step.

4. The method for preparing the BGA board according to claim 2, wherein said heat sink is an individual heat sink.

5. The method for preparing the BGA board according to claim 1, wherein the b) and c) step are carried out at 180 to 220° C. under a pressure of 30 to 40 Kg/cm$^2$.

6. The method for preparing the BGA board according to claim 1, wherein the board with a conductor circuit and an inner hole established, which is provided in the a) step, is prepared by establishing the inner hole in a CCL board and then establishing the conductor circuit, in which a sidewall of the board is plated.

7. The method for preparing the BGA board according to claim 1, wherein the board with a conductor circuit and an inner hole established, which is provided in the a) step, is prepared by establishing an inner slot in a CCL board, establishing the conductor circuit, and then establishing the inner hole with a drill, in which a sidewall of the board is plated.

8. A method for preparing the BGA board containing a plurality of printed circuit boards, in which a conductor circuit, an inner hole for mounting a semiconductor chip and a bonding pad to be electrically connected with the semiconductor chip are formed, comprising the steps of:
   a) providing top and bottom boards having neither inner hole nor conductor circuit, a board to contact with a bottom side of said top board in which an inner hole is established without a conductor circuit, and at least one of boards in which a conductor circuit and an inner hole are established;
   b) forming a primary-laminated structure with an opening part in an upper part thereof, by arraying the lower boards except said top board, and laminating the lower boards together by use of an adhesive to form a step-typed combination of the inner holes;
   c) forming a secondary-laminated structure by overlaying said top board onto the primary-laminated structure by use of the adhesive;
   d) forming through-holes in the secondary-laminated structure, followed by establishing a conductor circuit on the secondary-laminated structure including the through-holes by copper plating, dry film lamination, exposure, developing and etching;
   e) removing parts of the top and bottom boards which covers the step-typed combination of the inner holes to form a cavity with both vertical ends opened, followed by providing a bonding pad in the cavity to give an individual BGA board; and
   f) bonding a heat sink to a lower part of said individual BGA board by use of the adhesive.

9. The method for preparing the BGA board according to claim 8, wherein the adhesive is bigger than each inner hole of the boards except the top and bottom board by 40 to 60 $\mu$m in the b) step.

10. The method for preparing the BGA board according to claim 8, wherein said b) and c) step are carried out at 180 to 220° C. under a pressure of 30 to 40 Kg/cm$^2$.

11. The method for preparing the BGA board according to claim 8, wherein said heat sink is an individual heat sink.

12. The method for preparing the BGA board according to claim 8, wherein the board with a conductor circuit and an inner hole established, which is provided in the a) step, is prepared by establishing the inner hole in a CCL board and then establishing the conductor circuit, in which a sidewall of the board is plated.

13. The method for preparing the BGA board according to claim 8, wherein the board with a conductor circuit and an inner hole established, which is provided in the a) step, is prepared by establishing an inner slot in a CCL board, establishing the conductor circuit, and then establishing the inner hole with a drill, in which a sidewall of the board is plated.

* * * * *